US 6,528,836 B2

(12) United States Patent
Lee

(10) Patent No.: US 6,528,836 B2
(45) Date of Patent: Mar. 4, 2003

(54) PHOTOMASK ESD PROTECTION AND AN ANTI-ESD POD WITH SUCH PROTECTION

(75) Inventor: Fu-Sheng Lee, Tai-Chung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/904,388

(22) Filed: Jul. 12, 2001

(65) Prior Publication Data

US 2003/0013258 A1 Jan. 16, 2003

(51) Int. Cl.⁷ .............................................. H04L 27/108
(52) U.S. Cl. ........................ 257/298; 257/300; 257/355
(58) Field of Search ................................ 257/355, 298, 257/300

(56) References Cited

U.S. PATENT DOCUMENTS 5,602,046 A * 2/1997 Calafut et al. ................. 438/41
6,169,310 B1 * 1/2001 Kalnitsky et al. ............ 257/355

* cited by examiner

Primary Examiner—David Nelms
Assistant Examiner—Reneé R. Berry
(74) Attorney, Agent, or Firm—Tung & Associates

(57) ABSTRACT

An active anti-ESD pod for transporting photomask (reticle) comprises six body portions delimiting the container, an electrically conducting plate on the top portion, and an electrically conducting handle connected to the plate. An active charge sinker combined with a tag identifying the container or placed onto the photomask itself is provided to absorb the static electricity and to thus prevent charge accumulation that may otherwise cause ESD damage to the photomask.

10 Claims, 3 Drawing Sheets

PHOTOMASK ESD PROTECTION AND AN ANTI-ESD POD WITH SUCH PROTECTION

BACKGROUND OF THE INVENTION

1. Field of the Invention

The present invention relates in general to semiconductor technology, and more specifically to photomask protection from electrostatic damage and to a pod provided with such protection. Even more specifically, the invention relates to a photomask and a pod designed to perform active ESD protection.

2. Description of the Related Art

In the fabrication of semiconductor devices and integrated circuits (IC), electrostatic discharge (ESD) is a phenomenon that commonly occurs during the handling of semiconductor integrated circuit (IC) devices and one of the main factors causing IC damage that may turn into a very critical problem immediately affecting stable yield and smooth production.

As an example, the static electricity problem may arise when one walks on a carpet with semi-conductor wafers. Electrostatic voltage of about a few hundred volts may exist on one's body and wafers if relative humidity is high. With humidity being at its low, the electrostatic voltage may reach as high as about a few thousand volts. If a conductive object occasionally contacts the wafers, a strong ESD could occur and damage the ICs on the wafers. ESD is an especially serious problem for fabrication of a complementary metal-oxide semiconductor (CMOS) device.

Damage due to electrostatic charge, which may accumulate for various reasons and produce potentially destructive effects on an IC device, typically can occur during a testing phase of the IC fabrication or during assembly of the IC onto a circuit board, as well as during use of equipment, into which the IC has been installed. Damage to a single IC due to poor ESD protection in an electronic device can partially, or sometimes completely, hamper its functionality. ESD protection for semiconductor ICs is, therefore, a reliability issue.

Also, in high-resolution lithography, the dust is often attracted to the mask by static electricity, and, due to dust collecting on the mask, resolution impairment sometimes occurs. The solution proposed is to coat the entire photomask with a transparent, electrically conductive coating. The coating is electrically grounded to drain static charge. Conductive materials are often used for lithographic masks, but the patterns cannot be grounded effectively because of island regions existing in the pattern. If the pattern is itself conducting, then there is the added option of applying the antistatic layer under the pattern. If the pattern is formed of a photographic emulsion of a patterned photoresist, it is protected from damage and wear in handling by the harder conductive coating.

In one more aspect of the problem, it is to be understood that with the progress of the industry, technological dimensions of semiconductor devices and ICs become increasingly smaller. For example, a thinner gate oxide layer is necessary as the device integration increases. This causes that a gate-oxide breakdown voltage is approaching a junction breakdown voltage of a field effect transistor or even less. In addition, circuit architecture is usually designed by minimum design rules, in which a sufficient distance between a contact and a diffusion-region edge, or a contact and a gate edge may not be properly considered and designed. The result is that devices in high integration have poor performance to resist a substantial electrostatic transient current, and wafers are therefore damaged by the ESD phenomenon. In using photolithography, design rule shrinking causes even smaller mask pattern line spacing, and the ability of the mask to hold out against static electricity damage is becoming even weaker. Static electricity induce point discharge between the narrower lines, damage this pattern of lines and make them short. This is especially true for fabrication of a deep sub-micron IC.

In order to protect wafers from ESD damage, many methods to solve the ESD problem have been proposed. ESD stress models have been developed which are based on the reproduction of typical discharge pulses to which the IC may be exposed during manufacture or handling. Three standard models, known as the Human Body Model (HBM), Machine Model (MM), and Charged Device Model (CDM) have been developed. The human-body model is set forth in U.S. Military Standard MIL-STD-883, Method 3015.6. This Military Standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded while being handled.

Typically, the most common conventional method is to make an ESD protection circuit between input/output (I/O) pads and internal circuits including a coupling-type diode or a coupling-type metal-oxide semiconductor (MOS) device so that the ESD does not damage the ICs fabricated on the wafers. However, those protection circuits are power consuming and cannot endure a larger ESD stress. The gate-oxide thickness becomes small, as device integration gets high, resulting in a low gate-oxide breakdown voltage. If the gate-oxide breakdown voltage is as low as about the source/drain junction breakdown voltage, the ESD protection ability is severely degraded.

The conventional design for preventing ESD damage may also be illustrated by a prodigious network that, for the most part, involves locating a protection circuit between the input/output pads and the VSS terminal, between the input/output pads and the VDD terminal, and between the VSS and VDD power rails. Accordingly, such a prodigious network consumes a great amount of layout area, especially when used in a configuration including multi-power buses. Moreover, no ESD protection is provided between any two IC pads using the conventional design. Thus, ESD stress arising between two IC pads is only indirectly bypassed via the protection circuit located between the VSS and VDD power rails.

Beside the above-mentioned ESD-related problems and the elaborate efforts spent to protect IC from static electricity, one more problem of this sort exists that may also be fraught by destructive damage to IC components. In the semiconductor fabrication process, a square cross-sectional or rectangular cross-sectional container (a pod) made of plastic material is frequently used to transport articles. These articles may include silicon wafers, reticles, or other substrates used for building IC devices. (By reticle, a transparent ceramic substrate is understood that is coated with a metallic layer forming a pattern for an electronic circuit. The reticle is generally used in an imaging step during a photolithographic process where a pattern of a circuit is reproduced on the surface of an electronic substrate, i.e., on a wafer surface.)

A reticle can be made of any suitable transparent ceramic material. One of the most commonly used materials is quartz (a silicon dioxide). A quartz reticle can be readily coated with a chrome layer at selective areas to reproduce an electrical circuit. The chrome metal layer may be formed of either pure chromium or a chromium alloy. During a photolithographic imaging process, light from a light source is projected from one side of the reticle that is coated with the pattern such that the pattern can be reproduced on the surface of a wafer, which is positioned on the opposite side of the reticle. The pattern for the electronic circuit coated on the reticle is frequently laid out in a 5× magnification. The true dimensions of the electronic circuit reproduced on the wafer surface can be obtained by suitably adjusting the optical lenses placed between the reticle and the wafer. Metallic coatings other than chrome may also be put on the surface of the reticle for the circuit layout. However, chrome has been found to be an ideal material for its appearance of a brownish hue and the ease, with which human eyes can identify it.

In a semiconductor fabrication facility, static electricity or electrostatic discharge frequently develops on surfaces of articles made of insulating materials when they are touched or rubbed by other insulating materials such as insulating gloves. The electricity is produced based on a triboelectricity theory. The discharge of the static electricity to machines and to human operators can cause damage not only to semiconductor wafers but to process tools as well. Sometimes, it may even cause injury to a machine operator. It is therefore necessary in a semiconductor fabrication facility to control ESD by grounding the machines and controlling the relative humidity, or by building walls and floor coverings with slightly conductive materials such that electrical charges can be routed to ground. When the triboelectricity is suitably under control, it also mitigates the problem of dust and particulate contamination. For instance, the metal racks, pipelines, cabinets, cables, and rails are normally grounded in the facility to an equipotential bar or to a planar ground. The metal pedestals of the raised floor are then connected to the planar ground under the raised floor. To further enhance ESD protection, the metal framework of clean room wall systems is also connected to the planar ground. Air ionization systems are frequently installed at selected locations in the fabrication facility, to provide additional ESD control.

Despite the elaborate efforts spent in grounding process machines and various facilities, ESD damages still occur in a fabrication facility. A typical example of the ESD occurrence is when an insulating material is shipped or transported in a container made of another insulating material. For instance, it happens when a reticle is transported from a storage facility to a photolithography machine in a container, i.e. a pod, that is normally constructed of a thermoplastic material. Since the reticle itself is of an insulating material, i.e., quartz or other silicon dioxide-based materials coated with a chrome coating, when the pod is handled by machine operators wearing insulated gloves, the static charge on the pod significantly increases due to friction between the two insulating articles.

It has been confirmed, for instance, that the static electrical field induced on a pod surface increases from 0.1 kV/inch to nearly 15 kV/inch when a polycarbonate pod is rubbed with PVC gloves. Such a high static electricity build-up on the surface of the pod immediately causes a breakdown and an electrostatic discharge between the pod and the reticle contained therein. When ESD occurs between the pod and the reticle, the pattern on the reticle surface is usually damaged to such an extent that it can no longer be used for imaging. Conventional air ionization devices installed at a fabrication facility are not useful for preventing such ESD damages.

Various techniques have been proposed for controlling or minimizing ESD damages to reticles carried in plastic containers. For example, anti-electrostatic-type plastic materials such as Bayon® has been used for the construction of the pod. However, due to its high cost, this type of anti-electrostatic plastic material cannot be widely utilized in a fabrication facility. Also proposed has been the use of gloves made of a conductive material such as Propex® so that the breakdown with subsequent electrostatic discharge can be avoided. The high cost of the Propex® gloves prohibits its broad usage in the processing industry.

Also known in the art is a passive mode pod design. Reference is made in this connection to FIG. 1 where the structure of this kind is schematically presented. It comprises a pod 10 that has a top portion 12, a bottom portion 14, and two side portions 16 and 18. A mask 20 is placed inside the pod 10. A metallic plate 22 coats the top portion 12. A metallic handle 24 is attached to the metallic plate 22, the purpose of which is to collect static electricity and transfer it to an external auxiliary such as the operator's hand 26 to be dispatched at. A tag 28 is used to identify the pod 10.

This structure has some potential risk of inducing ESD damage when there is no suitable external auxiliary to dispatch the accumulated charges. For that reason, this passive type of protection cannot offer sufficient reliability of coping with static electricity.

SUMMARY OF THE INVENTION

Therefore, the object of the present invention is to provide photomask protection that being as advantageous as the protection known from the prior art would be free from its disadvantages.

It is a further object of the invention to secure photomask protection by way of providing an active anti-ESD pod structure.

More specifically, the object is achieved by providing a photomask comprising a pattern area and an electrically conducting area on its periphery for absorbing static electricity. The photomask is provided with means for an active anti-ESD protection to ensure a dynamic and spontaneous dispatching of an electrostatic charge.

In a preferred embodiment of the present invention, the active anti-ESD protection means includes an active charge sinker connected with the electrically conducting area to absorb static electricity immediately by itself, thus preventing any unexpected charge from accumulating and inflicting even micro ESD damage.

The active charge sinker is made of a first and a second switching diode in aiding connection therebetween, and a first and a second diode-resistive circuits connected to the first and second switching diodes, respectively, from their side, which is opposite to a side of connection of those switching diodes to each other. A point of connection of the active charge sinker to the electrically conducting area of the photomask is located between the first and second switching diodes.

The first diode-resistive circuit intended for consuming positive electrostatic charges comprises a third and a fifth diodes in aiding connection to each other, and a first and a third resistors. A first battery is connected between the first and third resistors. The third diode is connected to the first resistor, whereas the fifth diode is connected to the third resistor. A point of connection between the third diode and the first resistor is connected to the first switching diode.

The second diode-resistive circuit intended for consuming negative electrostatic charges comprises a fourth and a sixth diodes in aiding connection to each other, and a second and a fourth resistors. A second battery is connected between the second and fourth resistors. The fourth diode is connected to the second resistor, the sixth diode is connected to the fourth resistor. A point of connection between the fourth diode and the second resistor is connected to the second switching diode.

According to the present invention, the photomask may also comprise a fuse and indicator circuit placed electrically in the point of connection between the electrically conducting area, the first switching diode, and the second switching diode.

According to another aspect of the invention, a pod for transporting a photomask is provided comprising a metallic plate, which covers the pod, for absorbing static electricity. A characteristic feature of the pod that makes it different from the prior art is an active anti-ESD protection that is provided for the pod.

As with the photomask, the active anti-ESD protection is structured into an active charge sinker connected with the metallic plate. The active charge sinker comprises a first and a second switching diode in aiding connection therebetween, and a first and second diode-resistive circuits connected to the first and second switching diodes, respectively, from its side, which is opposite to a side of their aiding connection to each other. A point of connection of the active charge sinker to the metallic plate is located between the first and second switching diodes.

In a specific embodiment thereof, the first diode-resistive circuit intended for consuming positive electrostatic charges comprises a third and a fifth diodes in aiding connection therebetween, and a first and a third resistors with a first battery between those resistors. The third diode is connected to the first resistor, whereas the fifth diode is connected to the third resistor. A point of connection between the third diode and the first resistor is connected to the first switching diode.

Similarly, the second diode-resistive circuit intended for consuming negative electrostatic charges comprises a fourth and a sixth diodes in aiding connection therebetween, and a second and a fourth resistors. A second battery is connected between the second and fourth resistors. The fourth diode is connected to the second resistor, whereas the sixth diode is connected to the fourth resistor. A point of connection between the fourth diode and the second resistor is connected to the second switching diode.

The pod may further comprise a fuse and indicator circuit placed electrically in the point of connection between the metallic plate and the first and second switching diodes.

A method for protecting a photomask from electrostatic charge damage according to the present invention provides for a dynamic draining of the electrostatic charge from the photomask and performing the draining through absorbing the electrostatic charge by a charge sinker provided for on a pod for transporting the photomask or on the photomask itself.

BRIEF DESCRIPTION OF THE DRAWINGS

These and other objects, features and advantages of the present invention will be more clearly understood from the ensuing description of the preferred embodiment thereof when considered along with accompanying drawings, where.

DETAILED DESCRIPTION OF THE PREFERRED EMBODIMENTS

Figure 1:
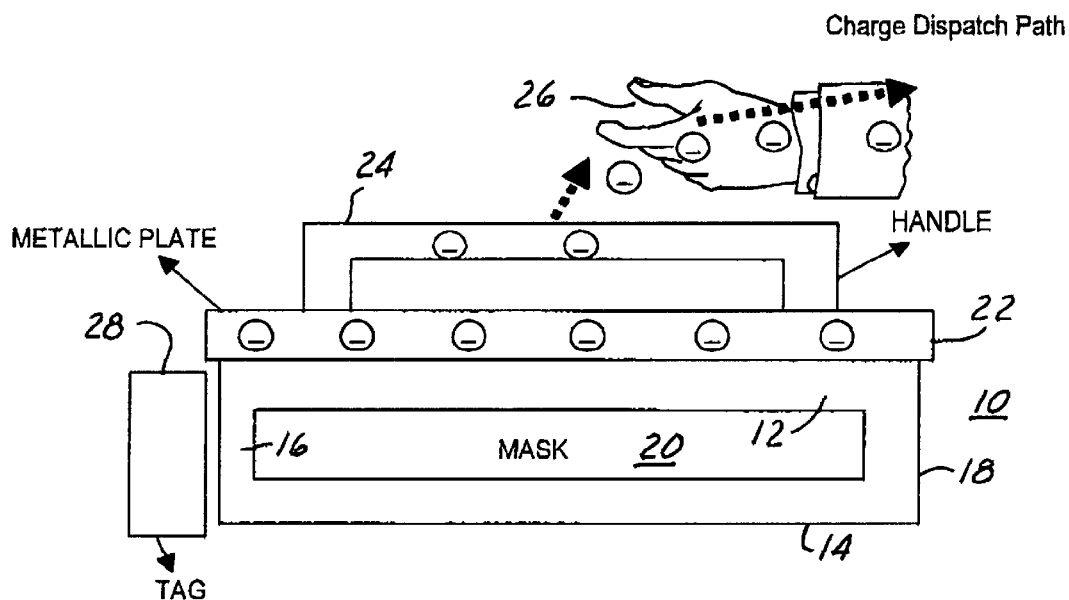
FIG. 1 is a simplified illustration of a passive mode pod structure known in the art.
Figure 2:
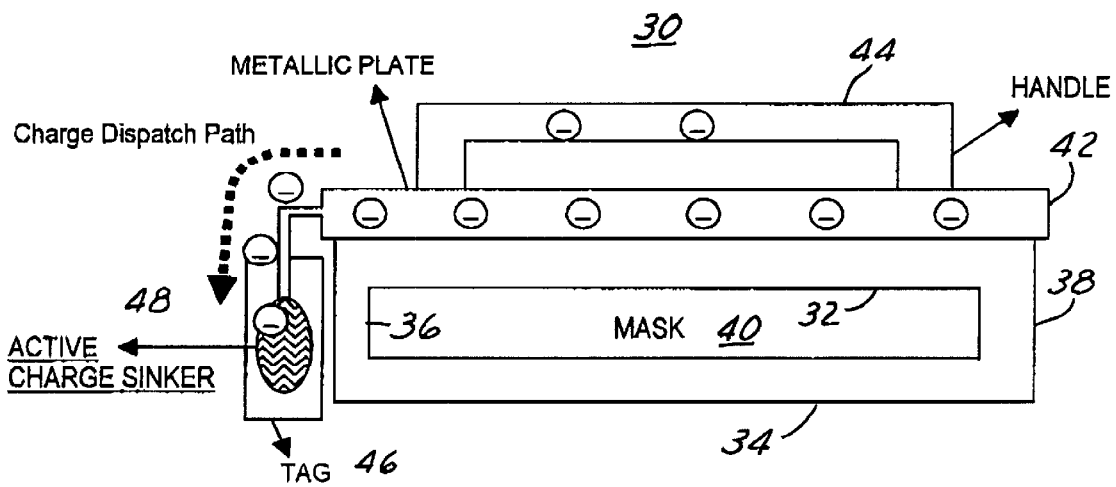
FIG. 2 is a simplified illustration of an active mode pod structure according to the present invention.

Referring now to FIG. 2, a pod (container) 30 for containing and transporting insulating articles such as photomask (reticle) is shown comprising six delimiting portions to form a cavity. These portions are a top portion 32, a bottom portion 34, and four side portions, of which portions 36 and 38 are shown, and a front and a back portions are not shown in FIG. 2. Generally, one of the four side portions provides access to the cavity of the container accommodating the photomask 40. All of the six portions are normally formed of an electrically insulating material such as plastic material. The material may be optically transparent to allow easy inspection of the insulated article carried therein.

A metallic plate or film 42 effectively reduces the impact of ESD on chrome-plated features on the reticle. The electrically conductive plate or film 42 further serves the function of electrical insulation during manual rubbing of the pod normally made of a non-conducting material. A handle 44, also of an electro-conducting material, is provided for convenient transporting the container.

A tag 46 that is used to identify the pod 30 may be electrically connected to the electrically conductive plate 42 and accommodate an active charge sinker 48 that is intended for absorbing the static electricity by itself. The sinker represents an "electricity sea" that keeps an electric potential of the pod stable. As soon as any occurrence induces an abnormal charge accumulation, the sinker will balance the charge and again stabilize the electric potential of the pod, whereby the protection of the photomask is secured.

Figure 3:
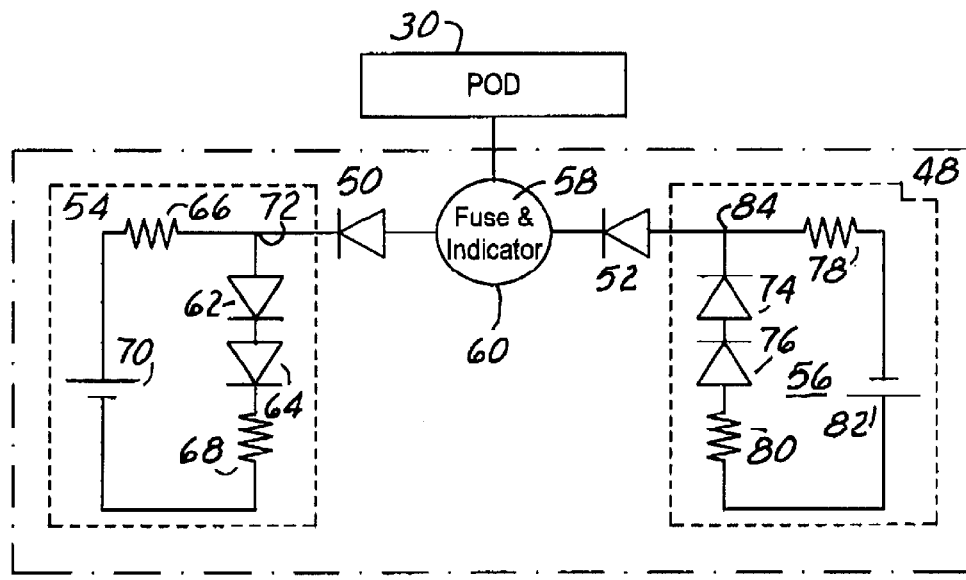
FIG. 3 is a schematic diagram of an example of the active charge sinker shown in FIG. 2.

Referring now to FIG. 3, the active charge sinker 48 comprises a first switching diode 50, a second switching diode 52, a first diode-resistive circuit 54, and a second diode resistive circuit 56. The diodes 50, 52 are in aiding connection, and a point 58 of their connection to each other, the point being invisible in FIG. 3 since a fuse and indicator circuit 60 is placed in the point 58, serves to connect the sinker 38 to the pod 30.

The first diode-resistive circuit 54 comprises a set of two diodes in aiding series connection with each other, namely a third diode 62 and a fourth diode 64, and also a first resistor 66 and a second resistor 68. With their first ends, the resistors 66, 68 are connected to the beginning and to the end of the set of the diodes 62, 64. Between the second ends of the resistors 66, 68, a first battery 70 is connected. A point 72 of connection of the resistor 66 and the diode 62 is connected to the first diode 50.

Polarity orientation of diodes 50, 62, and 64 is selected in the way that allows the circuit 54 to absorb positive electrostatic charge. For the diodes in the examples described herein, a breakdown voltage value is selected at about 0.7 V, resistance of resistors 64, 66 is selected at about 10 Ohm, voltage of fully charged battery 70 is selected at about 5 V. An indicator in the fuse and indicator circuit 60 is used to show lifetime of the battery and a current status of the sinkers.

The second diode-resistive circuit 56 similarly comprises a set of two diodes in aiding series connection with each other, namely a fourth diode 74 and a sixth diode 76, and also a second resistor 78 and a fourth resistor 80. With their first ends, the resistors 78, 80 are connected to the beginning and to the end of the set of the diodes 74, 76. Between the second ends of the resistors 78, 80, a second battery 82 is connected. A point 84 of connection of the resistor 78 and the diode 74 is connected to the second diode 52.

Polarity orientation of diodes 52, 76, and 78 is selected in the way that allows the circuit 56 to absorb negative electrostatic charge. For the diodes in the examples described herein, a breakdown voltage value is selected at about 0.7 V, resistance of resistors 78, 80 is selected at about 10 Ohm, voltage of fully charged battery 82 is selected at about 5 V.

In operation, the charge sinker 48 will represent an sort of "electric sea" for static electricity charge to keep the electric potential of the pod 30 stable. Whenever any occurrence induces an abnormal charge accumulation, the sinker 48 will absorb it. Any voltage surge in excess of the threshold value of about 0.7 V will turn the switching diode 50 (52) on, and if the voltage amplitude achieves 1.4 V, the diodes 62, 64 (74, 76) become conductive, and the circuit 54 (56) will consume the excessive charge balancing it and keeping the electric potential of the pod 30 stable again. The beauty of the structure according to the invention is that it can turn on the switch between the battery and static electricity source timely. And then the battery will absorb the charge accumulated on the pod. It is, therefore, understood that a method for protecting a photomask from electrostatic charge damage according to the present invention provides for a dynamic draining of the electrostatic charge from the photomask and performing the draining through absorbing the electrostatic charge by a charge sinker provided for on a pod for transporting the photomask or on the photomask itself.

Figure 4:
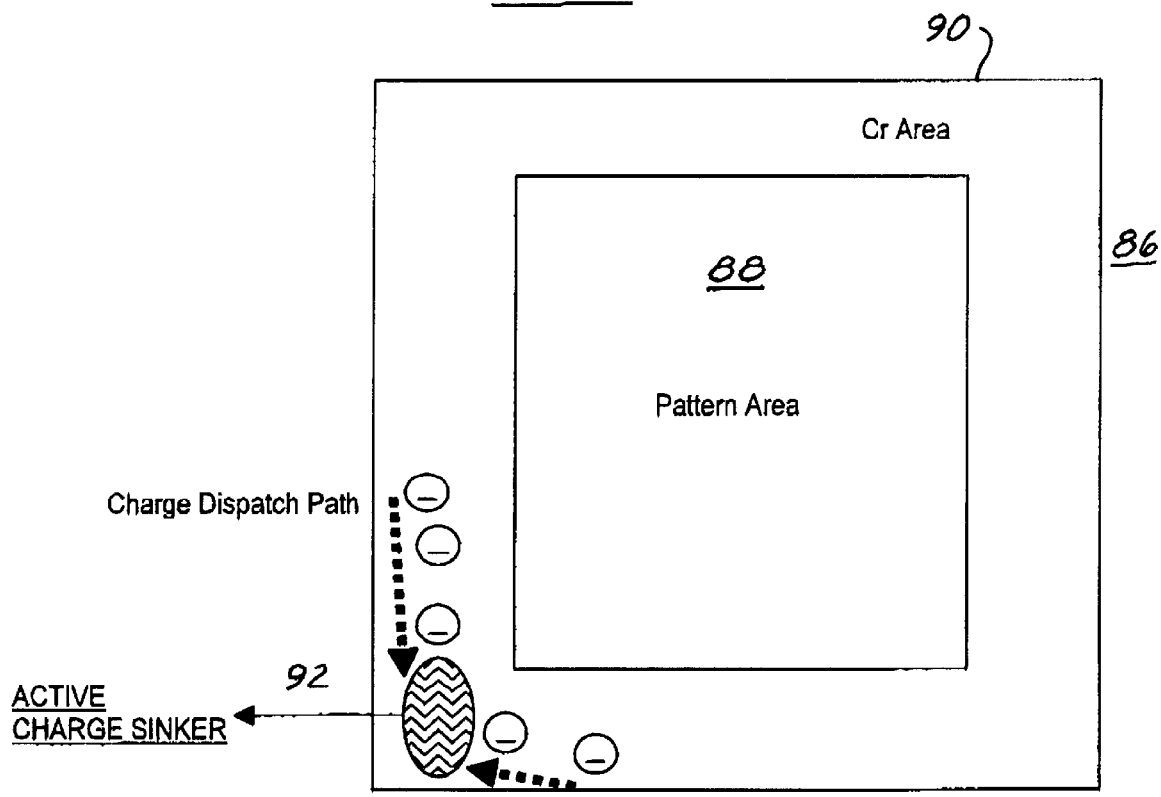
FIG. 4 illustrates another embodiment of the inventive concept according to the present invention shaped into a photomask provided with means for active anti-ESD protection.
Figure 5:
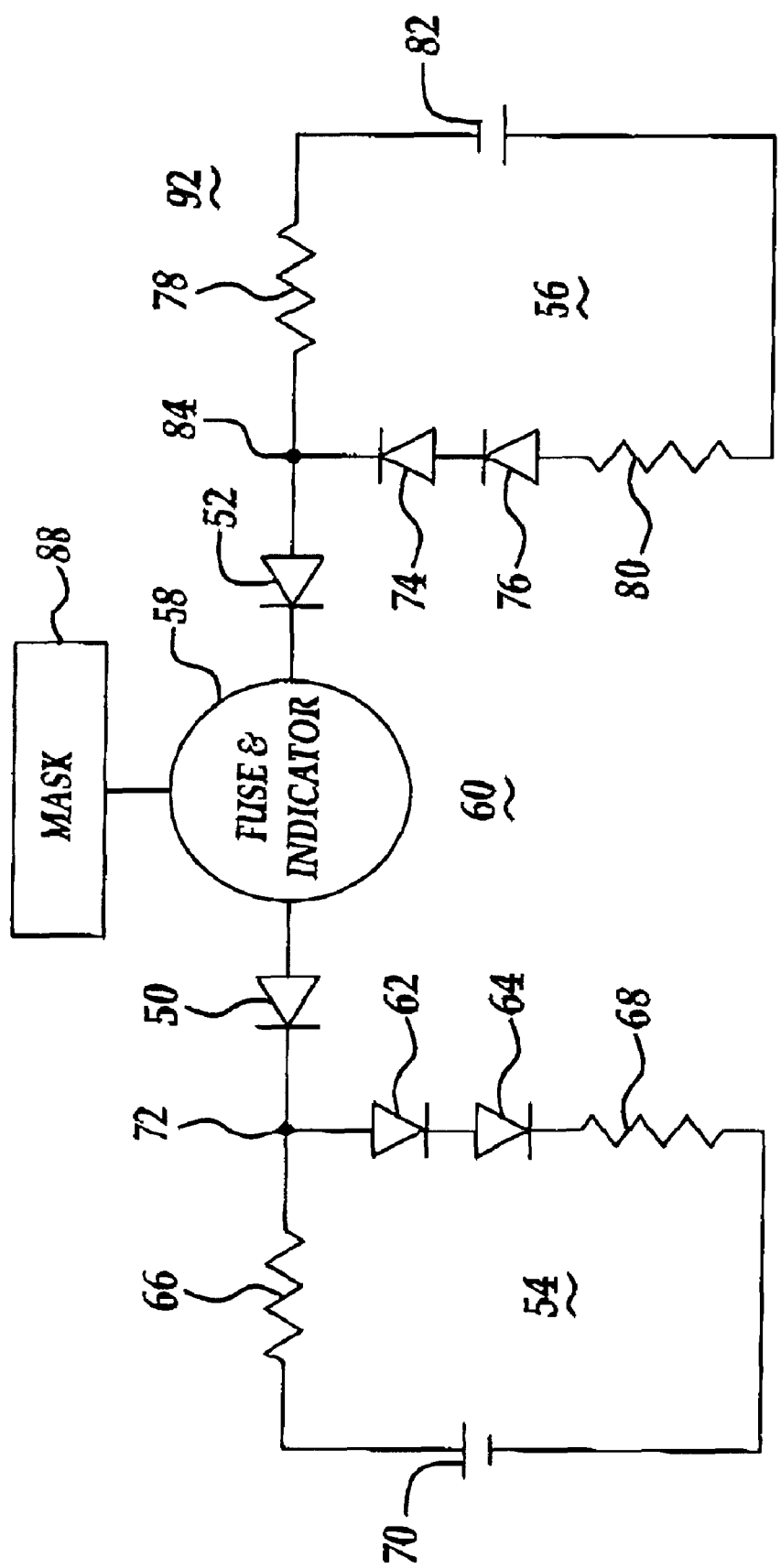
FIG. 5 is a schematic diagram of an example of the active charge sinker shown in FIG. 4.

Shown in FIGS. 4 and 5 are the structures for protection from ESD that are similar to those described in connection with FIGS. 2 and 3. Depicted in FIG. 4 is a mask 86 that has a pattern area 88 and an electrically conductive, for example, chrome coated, area 90 on a periphery of the pattern area. Placed on the area 90 and electrically connected therewith is an active anti-ESD protection circuit such as a charge sinker 92, whose function relative to the mask 86 is similar to the above-described function of the sinker 48 in relation to the pod 30. The structure and operation of the sinker 92 shown in FIG. 5 does not differ from that illustrated by and described with reference to FIG. 3.

While several embodiments of the present invention have been disclosed hereinabove, it is to be understood that these embodiments are given by example only and not in a limiting sense. Those skilled in the art may make various modifications and additions to the preferred embodiments chosen to illustrate the invention without departing from the spirit and scope of the present contribution to the art. Accordingly, it is to be realized that the patent protection sought and to be afforded hereby shall be deemed to extend to the subject matter claimed and all equivalence thereof fairly within the scope of the invention.

What is claimed is:

1. A photomask comprising a pattern area and an electrically conducting area on a periphery thereof for absorbing static electricity, further comprising means for an active anti-ESD protection to ensure a dynamic and spontaneous dispatching of an electrostatic charge.

2. The photomask according to claim 1, wherein said active anti-ESD protection means includes an active charge sinker connected with said conducting area.

3. The photomask according to claim 2, wherein said active charge sinker comprises a first and a second switching diode in aiding connection therebetween, a point of connection of said active charge sinker to said electrically conducting area being between said first and said second switching diodes, and a first and second diode-resistive circuits connected to said first and said second switching diodes, respectively, from a side thereof, which is opposite to a side of said aiding connection therebetween.

4. The photomask according to claim 3, wherein said first diode-resistive circuit intended for consuming positive electrostatic charges comprises a third and a fifth diodes in aiding connection therebetween, and a first and a third resistors with a first battery therebetween, said third diode being connected to said first resistor, said fifth diode being connected to said third resistor, and a point of connection between said third diode and said first resistor being connected to said first switching diode, whereas said second diode-resistive circuit intended for consuming negative electrostatic charges comprises a fourth and a sixth diodes in aiding connection therebetween, and a second and a fourth resistors with a second battery therebetween, said fourth diode being connected to said second resistor, said sixth diode being connected to said fourth resistor, and a point of connection between said fourth diode and said second resistor being connected to said second switching diode.

5. The photomask according to claim 3, further comprising a fuse and indicator circuit placed electrically in said point of connection between said electrically conducting area, said first switching diode, and said second switching diode.

6. A pod for transporting a photomask comprising a metallic plate, which covers the pod, for absorbing static electricity, wherein an active anti-ESD protection is provided.

7. The pod according to claim 6, wherein said active anti-ESD protection is structured into an active charge sinker connected with said metallic plate.

8. The pod according to claim 7, wherein said active charge sinker comprises a first and a second switching diode in aiding connection therebetween, a point of connection of said active charge sinker to said metallic plate being between said first and said second switching diodes, and a first and second diode-resistive circuits connected to said first and said second switching diodes, respectively, from a side thereof, which is opposite to a side of said aiding connection therebetween.

9. The pod according to claim 8, wherein said first diode-resistive circuit intended for consuming positive electrostatic charges comprises a third and a fifth diodes in aiding connection therebetween, and a first and a third resistors with a first battery therebetween, said third diode being connected to said first resistor, said fifth diode being connected to said third resistor, and a point of connection between said third diode and said first resistor being connected to said first switching diode, whereas said second diode-resistive circuit intended for consuming negative electrostatic charges comprises a fourth and a sixth diodes in aiding connection therebetween, and a second and a fourth resistors with a second battery therebetween, said fourth diode being connected to said second resistor, said sixth diode being connected to said fourth resistor, and a point of connection between said fourth diode and said second resistor being connected to said second switching diode.

10. The pod according to claim 8, further comprising a fuse and indicator circuit placed electrically in said point of connection between said metallic plate, said first switching diode, and said second switching diode.

* * * * *